US00RE40962E

(19) United States
(12) Reissued Patent
Lenander et al.

(10) Patent Number: US RE40,962 E
(45) Date of Reissued Patent: Nov. 10, 2009

(54) CEMENTED CARBIDE INSERT

(75) Inventors: Anders Lenander, Tyreso (SE); Mikael Lindholm, Hagersten (SE)

(73) Assignee: Sandvik Intellectual Property Aktiebolag, Sandviken (SE)

(21) Appl. No.: 11/483,385

(22) Filed: Jul. 10, 2006

Related U.S. Patent Documents

Reissue of:
(64) Patent No.: 6,616,970
Issued: Sep. 9, 2003
Appl. No.: 09/988,315
Filed: Nov. 19, 2001

U.S. Applications:
(62) Division of application No. 09/545,448, filed on Apr. 7, 2000, now Pat. No. 6,344,264.

(30) Foreign Application Priority Data

Apr. 8, 1999 (SE) ..... 9901243

(51) Int. Cl.
*C23C 16/32* (2006.01)

(52) U.S. Cl. ..... 427/249.19; 427/255.391; 427/376.1

(58) Field of Classification Search ..... 427/249.19, 427/255.391, 376.1; *C23C 16/32*
See application file for complete search history.

(56) References Cited

U.S. PATENT DOCUMENTS 4,277,283 A * 7/1981 Tobioka et al. ..... 75/238
4,497,874 A * 2/1985 Hale ..... 428/551
4,610,931 A * 9/1986 Nemeth et al. ..... 428/547
4,636,252 A * 1/1987 Yoshimura et al. ..... 75/238
4,698,266 A * 10/1987 Buljan et al. ..... 428/457
4,708,037 A * 11/1987 Buljan et al. ..... 82/1.11
4,923,512 A * 5/1990 Timm et al. ..... 75/239
5,403,628 A * 4/1995 Konig et al. ..... 427/569
5,441,693 A * 8/1995 Ederyd et al. ..... 419/10
5,484,468 A * 1/1996 Ostlund et al. ..... 75/236
5,494,635 A * 2/1996 Bennett ..... 419/14
5,549,980 A * 8/1996 Ostlund et al. ..... 428/698
5,612,264 A * 3/1997 Nilsson et al. ..... 501/87
5,649,279 A * 7/1997 Gustafson et al. ..... 419/25
5,654,035 A * 8/1997 Ljungberg et al. ..... 427/255.34
5,674,564 A * 10/1997 Ljungberg et al. ..... 427/255.34
5,702,808 A * 12/1997 Ljungberg ..... 428/216
5,729,823 A * 3/1998 Gustafson et al. ..... 428/552
5,766,782 A * 6/1998 Ljungberg ..... 428/698
5,786,069 A * 7/1998 Ljungberg et al. ..... 428/216
6,071,464 A * 6/2000 Funaki et al. ..... 264/603
6,326,093 B1 * 12/2001 Lindholm et al. ..... 428/699
6,333,100 B1 12/2001 Palmqvist et al.
6,410,086 B1 * 6/2002 Brandon et al. ..... 427/248.1
6,468,680 B1 * 10/2002 Waldenstrom et al. ..... 428/698
6,699,526 B2 * 3/2004 Palmqvist et al. ..... 427/249.19
6,887,296 B2 * 5/2005 Mende et al. ..... 75/351
RE39,814 E * 9/2007 Lindholm et al. ..... 428/699

FOREIGN PATENT DOCUMENTS

EP 0697465 * 2/1996
EP 1026271 * 8/2000
WO WO 97/09463 * 3/1997
WO WO 98/03691 * 1/1998

* cited by examiner

*Primary Examiner*—Bret Chen
(74) *Attorney, Agent, or Firm*—Drinker Biddle & Reath LLP

(57) ABSTRACT

Methods of making a coated cemented carbide body include: forming a powder mixture having WC, 5–12 wt % Co, 3–11% cubic carbides of Ta and Ti with a ratio of Ta/Ti is 1.0–4.0; adding N in an amount of 0.6–2.0% of the weight of Ta and Ti; milling and spray-drying the mixture to form a powder; compacting and sintering the powder at a temperature of 1300–1500° C., in a controlled atmosphere of about 50 mbar followed by cooling, whereby a body having a binder phase enriched and essentially gamma-phase free surface zone of 5–50 μm in thickness is obtained; applying a pre-coating treatment to the body; and appling a hard, wear-resistant coating to the body.

19 Claims, 1 Drawing Sheet

CEMENTED CARBIDE INSERT

Matter enclosed in heavy brackets [ ] appears in the original patent but forms no part of this reissue specification; matter printed in italics indicates the additions made by reissue.

[This application is a divisional of application Ser. No. 09/545,448, filed on Apr. 7, 2000, now U.S. Pat. No. 6,344,264.]

*CROSS-REFERENCES TO RELATED APPLICATIONS*

*The present application is a reissue of U.S. Pat. No. 6,616,970 B2 filed on Nov. 19, 2001, which is a divisional application of U.S. Pat. No. 6,344,264 B2, filed on Apr. 7, 2000, which claims the benefit of priority to Swedish Application No. 9901243-7 filed Apr. 8, 1999.*

BACKGROUND OF THE INVENTION

The present invention relates to a coated cemented carbide cutting tool insert particularly useful for turning operations in steels or stainless steels, and is especially suited for operations with high demands regarding toughness properties of the insert.

High performance cutting tools must nowadays possess high wear resistance, high toughness properties and good resistance to plastic deformation. Improved toughness behaviour of a cutting insert can be obtained by increasing the WC grain size and/or by raising the overall binder phase content, but such changes will simultaneously result in significant loss of the plastic deformation resistance.

Methods to improve the toughness behaviour by introducing an essentially gamma phase-free and binder phase-enriched surface zone with a thickness of about 20–40 μm on the inserts by so-called "gradient sintering" techniques have been known for some time e.g. U.S. Pat. Nos. 4,277,283, 4,497,874, 4,548,786, 4,640,931, 5,484,468, 5,549,980, 5,649,279, 5,729,823. The characteristics of these patents are that the surface zone has a different composition than the bulk composition, and is depleted of gamma phase and binder phase enriched.

SUMMARY OF THE INVENTION

It has now surprisingly been found that by using a gamma phase consisting essentially of only TaC and TiC in addition to WC, by keeping the ratio between the elements Ta and Ti within specific limits, and having a highly W-alloyed binder phase, the toughness properties of the gradient sintered cutting inserts can be significantly improved without any loss of plastic deformation resistance.

A first aspect of the present invention provides a cutting tool insert for machining steel comprising a cemented carbide body comprising WC, 5–12 wt. % Co, 3–11 wt. % of cubic carbides of the metals Ta and Ti, and less than 0.1 wt. % of Nb where the ratio of Ta/Ti is 1.0–4.0, and the Co-binder phase is highly alloyed with W, having a CW-ratio of 0.75–0.95, the body also comprising a binder phase enriched and essentially gamma phase free surface zone with a thickness of 5–50 μm; and a coating.

A second aspect of the present invention provides a method of making a coated cemented carbide body having a gamma phase-free and binder rich surface zone comprising the steps of:

(i) forming a powder mixture comprising WC, 5–12 wt. % Co, 3–11 wt. % cubic carbides of Ta and Ti, where the ratio of Ta/Ti is 1.0–4.0;

(ii) adding N in an amount of 0.6–2.0% of the weight of Ta and Ti;

(iii) milling and spray drying the mixture to form a powder material with the desired properties;

(iv) compacting and sintering the powder material at a temperature of 1300–1500° C., in a controlled atmosphere of about 50 mbar followed by cooling, whereby a body having a binder phase enriched and essentially gamma phase free surface zone of 5–50 μm in thickness is obtained;

(v) applying a pre-coating treatment to the body; and (vi) applying a hard, wear resistant coating.

DETAILED DESCRIPTION OF PREFERRED EMBODIMENTS

Figure 1:
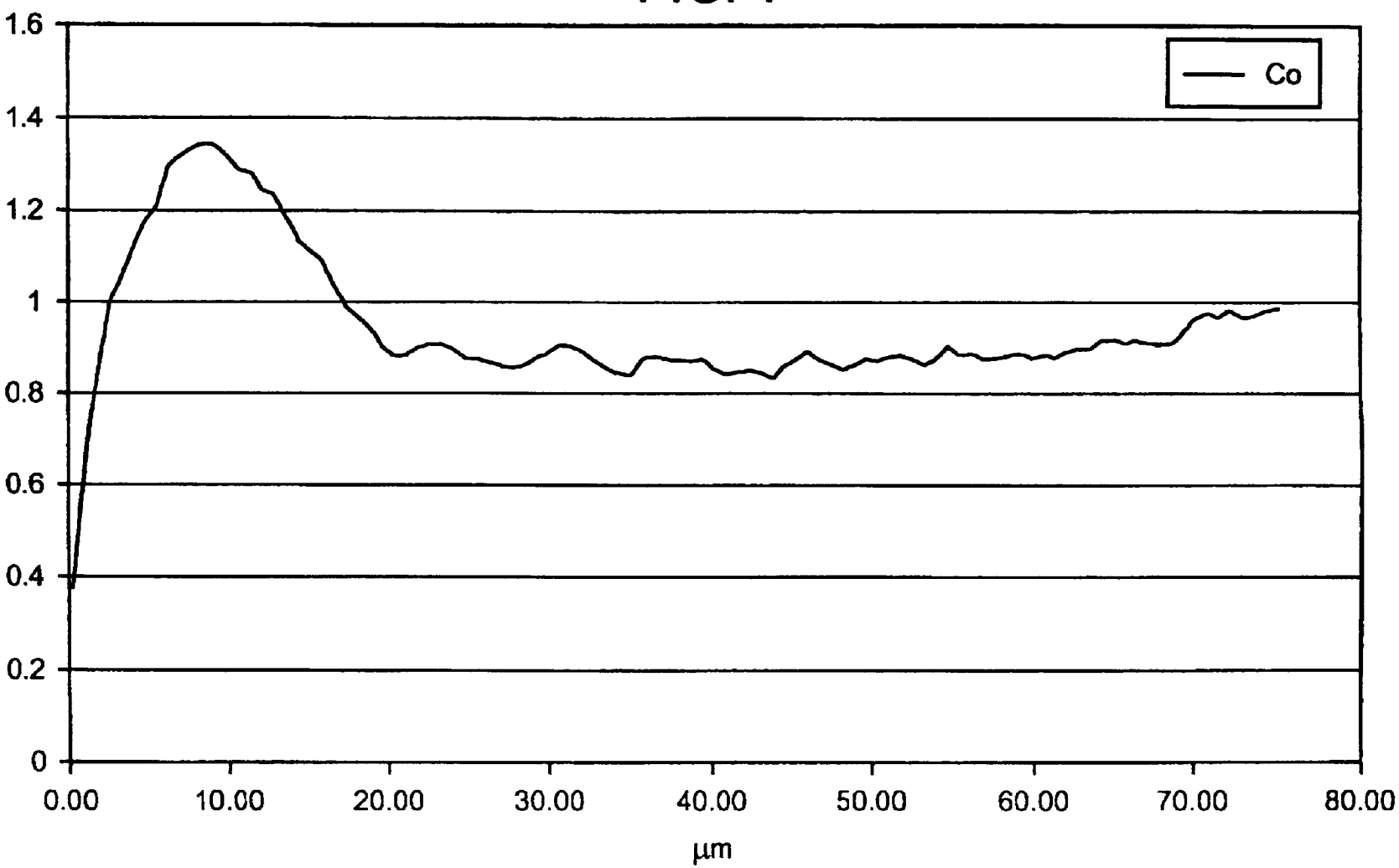
FIG. 1 is a plot showing the level of Co enrichment near the surface of an insert formed according to the present invention.

According to the present invention there is now provided a coated cemented carbide insert with a 5–50 μm thick, preferably 10–30 μm thick, essentially gamma phase free and binder phase-enriched surface zone with an average binder phase content (by volume) preferably in the range 1.2–2.0 times the bulk binder phase content.

The gamma phase consists essentially of TaC and TiC and of any WC that dissolves into the gamma phase during sintering. The ratio Ta/Ti is between 1.0 and 4.0, preferably 2.0–3.0.

The binder phase is highly W-alloyed. The content of W in the binder phase can be expressed as a $$\text{CW-ratio}=M_s/(\text{wt. \% Co}*0.0161) \text{ where}$$

$M_s$ is the measured saturation magnetization of the cemented carbide body in [kA/m] $hAm^2/kg$ and wt-% Co is the weight percentage of Co in the cemented carbide. The CW-ratio takes a value less than or equal to 1. The lower the CW-ratio, the higher the W-content in the binder phase. It has now-been found according to the invention that an improved cutting performance is achieved if the CW-ratio is in the range 0.75–0.95, preferably 0.80–0.85.

The present invention is applicable to cemented carbides with a composition of 5–12, preferably 9–11, weight percent of Co binder phase, and 3–11, preferably 7–10, weight percent TaC+TiC, and the balance being WC. The Nb content should not exceed 0.1 weight percent. The weight ratio Ta/Ti should be 1.0–4.0, preferably 2.0–3.0. The WC preferably has an average grain size of 1.0 to 4.0 μm, more preferably 1.5 to 3.0 μm. The cemented carbide body may contain less than 1 volume % of η-phase ($M_6C$).

Inserts according to the invention are further provided with a coating preferably comprising 3–12 μm columnar TiCN-layer followed by a 1–8 μm thick $Al_2O_3$-layer deposited, for example, according to any of the U.S. Pat. Nos. 5,766,782, 5,654,035, 5,974,564, 5,702,808, preferably a κ-$Al_2O_3$-layer and preferably with an outermost thin layer of TiN which preferably is removed in the edge line by brushing or by blasting.

According to the invention, by applying coatings with different thickness on the cemented carbide body the property of the coated insert can be optimised to suit specific cutting conditions.

In one embodiment, a cemented carbide insert produced according to the invention is provided with a coating of: 6

μm TiCN, 5 μm $Al_2O_3$ and 1 μm TiN. This coated insert is particularly suited for cutting operation in steel.

In another embodiment, a cemented carbide insert produced according to the invention is provided with a coating of: 4 μm TiN, 2 μm $Al_2O_3$ and 1 μm TiN. This coating is particularly suited for cutting operations in stainless steels.

The invention also relates to a method of making cutting inserts comprising a cemented carbide substrate of a binder phase of Co, WC, a gamma phase of Ta and Ti, a binder phase enriched surface zone essentially free of gamma phase, and a coating. A powder mixture containing 5–12, preferably 9–11, weight percent of binder phase consisting of Co, and 3–11, preferably 7–10, weight percent TaC+TiC, and the balance WC with an average grain size of 1.0–4.0 μm, more preferably 1.5–3.0 μm, is prepared. The Nb content should not exceed 0.1 weight percent. The weight ratio Ta/Ti should be 1.0–4.0, preferably 2.0–3.0. Well-controlled amounts of nitrogen have to be added either the powder as carbonitrides and/or added during the sintering process via the sintering gas atmosphere. The amount of nitrogen added will determine the rate of dissolution of the cubic phases during the sintering process and hence determine the overall distribution of the elements in the cemented carbide after solidification. The optimum amount of nitrogen to be added depends on the composition of the cemented carbide and, in particular, on the amount of cubic phases and varies between 0.6 and 2.0% of the weight of the elements Ti and Ta. The exact conditions depend to a certain extent on the design of the sintering equipment being used. It is within the purview of the skilled artisan to determine whether the requisite surface zone of the cemented carbide have been obtained and to modify the nitrogen addition and the sintering process in accordance with the present specification in order to obtain the desired result.

The raw materials are mixed with pressing agent and, optionally W, such that the desired CW-ratio is obtained. The mixture is milled and spray dried to obtain a powder material with the desired properties. Next, the powder material is compacted and sintered. Sintering is performed at a temperature of 1300–1500° C., in a controlled atmosphere of about 50 mbar followed by cooling. After conventional post sintering treatments, including edge rounding, a hard, wear resistant coating according to above is deposited by CVD- or MT-CVD-technique.

EXAMPLE 1

A.) Cemented carbide turning inserts of the style CNMG 120408-PM and SNMG120412-PR with the composition 9.9 wt % Co, 6.0 wt % TaC, 2.5 wt % TiC, and 0.3 wt % TiN, with the balance WC having an average grain size of 2.0 μm were produced according to the invention. The nitrogen was added to the carbide powder as TiCN. Sintering was done at 1450° C. in a atmosphere of Ar at a total pressure of about 50 mbar.

Metallographic investigation showed that the inserts had a gamma phase free zone of 15 μm. FIG. 1 shows a plot of the Co enrichment near the surface measured by an image analysis technique. The Co is enriched to a peak level of 1.3 times the bulk content. Magnetic saturation values were recorded and used for calculating CW-values. An average CW-value of 0.81 was obtained.

After a pre-coating treatment like edge honing, cleaning etc. The inserts were coated in a CVD-process comprising a first thin layer (less than 1 μm) of TiN followed by 6 μm thick layer of TiCN with columnar grains by using MTCVD-techniques (process temperature 850° C. and $CH_3CN$ as the carbon/nitrogen source). In a subsequent process step during the same coating cycle, a 5 μm thick κ-$Al_2O_3$ layer was deposited according to U.S. Pat. No. 5,974,564. On top of the κ-$Al_2O_3$ layer a 1.0 μm TiN layer was deposited. The coated inserts were brushed in order to smoothly remove the TiN coating from the edge line.

B.) Cemented carbide turning inserts of the style CNMG 120408-PM and SNMG120412-PR with the composition 10.0 wt % Co, 2.9 wt % TaC, 3.4 wt % TiC, 0.5 wt % NbC and 0.2 wt % TiN and the balance WC with an average grain size of 2.1 μm were produced. The inserts were sintered in the same process as A. Metallographic investigation showed that the produced inserts had a gamma phase free zone of 15 μm. Magnetic saturation values were recorded and used for calculating CW-values. An average CW-value of 0.81 was obtained. The inserts were subject to the same pre-coating treatment as A, coated in the same coating process and also brushed in the saute way as A.

C.) Cemented carbide turning inserts of the style CNMG 120408-PM and SNMG120412-PR with the composition 10.0 wt % Co, 3.0 wt % TaC, 6.3 wt % ZrC and balance WC with an average grain size of 2.5 μm were produced.

Metallographic investigation showed that the produced inserts had a gamma phase free zone of 12 μm. Magnetic saturation values were recorded and used for calculating CW-values. An average CW-value of 0.79 was obtained. The inserts were subject to the same pre-coating treatment as A, coated in the same coating process and also brushed in the same way as A.

EXAMPLE 2

Inserts from A, B and C were tested with respect to toughness in a longitudinal turning operation with interrupted cuts.

Material; Carbon steel SS1312.

Cutting data:

| | |
|---|---|
| Cutting speed | 130 m/min |
| Depth of cut | 1.5 mm |

Feed=Starting with 0.15 mm and gradually increased by 0.10 mm/min until breakage of the edge 8 edges of each variant were tested Inserts style: CNMG120408-PM Results:

| | Mean feed at breakage |
|---|---|
| Inserts A | 0.31 mm/rev |
| Inserts B | 0.22 mm/rev |
| Inserts C | 0.22 mm/rev |

EXAMPLE 3

Inserts from A, B and C were tested with respect to resistance to plastic deformation in longitudinal turning of alloyed steel (AISI 4340).

Insert style: CNMG 120408-PM

Cutting data:

| | |
|---|---|
| Cutting speed = | 100 m/min |
| Feed = | 0.7 mm/rev. |
| Depth of cut = | 2 mm |
| Time in cut = | 0.50 min |

The plastic deformation was measured as the edge depression at the nose of the inserts.

Results:

| | Edge depression, μm |
|---|---|
| Insert A | 49 |
| Insert B | 63 |
| Insert C | 62 |

EXAMPLE 4

Tests performed at an end user producing rear shaft for lorries. The inserts from A and C were tested in a three turning operations with high toughness demands due to interrupted cuts. The inserts were run until breakage of the edge. The inert style SNMG120412-PR was used.

Results:

| | Number of machined components | | |
|---|---|---|---|
| Operation | 1 | 2 | 3 |
| Variant A | 172 | 219 | 119 |
| Variant C | 20 | 11 | 50 |

Examples 2, 3 and 4 show that the inserts A according to the invention surprisingly exhibit much better toughness in combination with somewhat better plastic deformation resistance in comparison to conventional inserts B and C.

The foregoing has described the principles, preferred embodiments and modes of operation of the present invention. However, the invention should not be construed as being limited to the particular embodiments discussed. Thus the above-described embodiments should be regarded as illustrative rather than restrictive, and it should be appreciated that variations may be made in those embodiments by workers skilled in the art without departing from the scope of the present invention as defined by the following claims.

We claim:

1. A method of making a coated cemented carbide body having a gamma phase-free and binder rich surface zone comprising the steps of:

(i) forming a powder mixture comprising WC, 5–12 wt. % Co, 3–11 wt. % cubic carbides of Ta and Ti, where the ratio of Ta/Ti is 1.0–4.0;

(ii) adding N in an amount of 0.6–2.0% of the weight of Ta and Ti;

(iii) milling and spray drying the mixture to form a powder material with the desired properties;

(iv) compacting and sintering the powder material at a temperature of 1300–1500° C., in a controlled atmosphere of about 50 mbar followed by cooling, whereby a body having a binder phase enriched and essentially gamma phase free surface zone of 5–50 μm in thickness is obtained;

(v) applying a pre-coating treatment to the body; and (vi) applying a hard, wear resistant coating.

2. The method of claim 1, further comprising adding a pressing agent and W to the powder mixture in an amount to give the body a CW ratio of 0.75–0.95, the CW ratio is expressed as CW ratio=$M_s$/(wt. % Co*0.0161), where $M_s$ is the measured saturization magnetization of the body and wt. % Co is the weight percentage of Co in the cemented carbide.

3. The method according to claim 1, wherein the powder mixture comprises 7–10 wt. % of cubic carbides of the metals Ta and Ti.

4. The method according to claim 1, wherein the coating is applied using a CVD-technique.

5. The method according to claim 1, wherein the coating is applied using a MT-CVD-technique.

*6. The method of claim 1, wherein the surface zone is approximately 10-30 μm thick.*

*7. The method of claim 1, wherein the surface zone has a binder phase content 1.2-2.0 times the binder phase content in the rest of the body.*

*8. The method of claim 1, wherein the Ta/Ti-ratio is 2.0-3.0.*

*9. The method of claim 2, wherein the CW ratio is 0.8-0.85.*

*10. The method of claim 1, wherein the Co content is 9-11 wt. %.*

*11. The method of claim 1, wherein the combined content of TaC and TiC is 3-11 wt. %.*

*12. The method of claim 1, wherein the body comprises WC having a grain size of 1.0-4.0 μm.*

*13. The method of claim 12, wherein the grain size is 1.5-3.0 μm.*

*14. The method of claim 1, wherein the coating comprises a 3-12 μm columnar TiCN-layer, followed by a 1-8 μm thick $Al_2O_3$-layer.*

*15. The method of claim 14, wherein the coating comprises an outermost layer of TiN.*

*16. The method of claim 15, comprising removing the TiN layer at an edge line of the body.*

*17. The method of claim 14, wherein the $Al_2O_3$-layer is κ-$Al_2O_3$.*

*18. The method of claim 17, wherein the coating comprises an outermost layer of TiN.*

*19. The method of claim 18, comprising removing the TiN layer at an edge line of the body.*

* * * * *